(12) United States Patent
Nishizu (10) Patent No.: US 11,464,108 B2
(45) Date of Patent: Oct. 4, 2022

(54) FLEXIBLE SUBSTRATE

(71) Applicant: Mitsubishi Electric Corporation, Tokyo (JP)

(72) Inventor: Shinjiro Nishizu, Isahaya (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/053,161

(22) PCT Filed: Aug. 23, 2018

(86) PCT No.: PCT/JP2018/031158
§ 371 (c)(1),
(2) Date: Nov. 5, 2020

(87) PCT Pub. No.: WO2020/039550
PCT Pub. Date: Feb. 27, 2020

(65) Prior Publication Data
US 2021/0243882 A1   Aug. 5, 2021

(51) Int. Cl.
*H05K 1/02*   (2006.01)

(52) U.S. Cl.
CPC ... *H05K 1/028* (2013.01); *H05K 2201/09063* (2013.01)

(58) Field of Classification Search
CPC . H05K 1/028; H05K 2201/09063; H05K 1/02
USPC ........................................................ 174/254
See application file for complete search history.

(56) References Cited

U.S. PATENT DOCUMENTS

| | | | |
|---|---|---|---|
| 5,717,556 A * | 2/1998 | Yanagida | H05K 1/028 174/254 |
| 9,769,920 B2 * | 9/2017 | Ely | H05K 1/028 |
| 2002/0157865 A1 * | 10/2002 | Noda | H05K 1/0227 174/261 |

(Continued)

FOREIGN PATENT DOCUMENTS

| | | |
|---|---|---|
| JP | 2007-067380 A | 3/2007 |
| JP | 2015-138476 A | 7/2015 |
| JP | 2016-021555 A | 2/2016 |

OTHER PUBLICATIONS

International Search Report issued in PCT/JP2018/031158; dated Oct. 16, 2018.

(Continued)

*Primary Examiner* — Sherman Ng
(74) *Attorney, Agent, or Firm* — Studebaker & Brackett PC (57) ABSTRACT

A flexible substrate includes a base substrate layer; and two patter layers laminated together on the front- and back-sides of the flexible substrate, on which electric circuit lines are printed each. In order to reduce a stress generated in the flexible substrate when it is folded and soldered to an optical communication semiconductor package, the flexible substrate has a thickness-wise concavely deformed portion in a lengthwise middle portion thereof. Also to reduce the stress, the flexible substrate having the deformed portion further has end sections and a middle section formed in its longitudinal direction, and the widths of the end sections are larger than that of the middle section, and the flexible substrate having the deformed portion further has holes and holes respectively formed near the side edges of a lengthwise middle section thereof.

6 Claims, 5 Drawing Sheets

(56) References Cited

U.S. PATENT DOCUMENTS

2007/0031091 A1     2/2007  Mitamura et al.
2008/0289859 A1*   11/2008  Mikado .............. H05K 1/0281
                                                           174/254
2017/0111990 A1     4/2017  Im
2017/0273197 A1*    9/2017  Ohara .................... H05K 3/32

OTHER PUBLICATIONS

An Office Action; "Notice of Reasons for Refusal", mailed by the Japanese Patent Office dated Nov. 2, 2021, which corresponds to Japanese Patent Application No. 2020-537964 and is related to U.S. Appl. No. 17/053,161; with English language translation.

An Office Action; "Notice of Reasons for Refusal," mailed by the Japanese Patent Office dated Apr. 5, 2022, which corresponds to Japanese Patent Application No. 2020-537964 and is related to U.S. Appl. No. 17/053,161 with English language translation.

* cited by examiner

FLEXIBLE SUBSTRATE

TECHNICAL FIELD

The present application relates to flexible substrates.

BACKGROUND ARTS

Conventional flexible substrates (also referred to as flexible printed circuit substrates or flexible printed circuits (FPC)) used for connecting optical communication semiconductor packages have a flat and linear shape in its longitudinal direction. However, a flexible substrate used for connecting an optical communication semiconductor package is ordinarily folded in an actual use such as because of constraints in packaging a product. Specifically, the flexible substrate is used with it being folded such as when soldered to the package.

PRIOR ART DOCUMENT

Patent Document

Patent Document 1: JP2015-138476A

SUMMARY OF THE INVENTION

Problem that the Invention is to Solve

As described above, since the flexible substrate for connecting an optical communication semiconductor package is used with it being folded when soldered to the package, a bending stress is generated in the flexible substrate by the result of the folding. And the resultant bending stress raises a problem that the flexible substrate is not able to perform its function to fulfill.

A conventional flexible substrate for connecting an optical communication semiconductor package is made up of at least one base substrate layer, a front-side pattern layer on which at least one layer of electric circuit lines are printed, and a back-side pattern layer on which at least one layer of electric circuit lines are printed. When the flexible substrate thus made up is folded, a portion of the pattern of the front-side pattern layer of the flexible substrate is damaged, and this leads to occurrence of a break or a pinhole in a portion of the patterned electric circuit lines printed. And the break or pinhole in the portion of the patterned electric circuit lines electrically opens an electric circuit line of the flexible substrate, thus raising a problem that the flexible substrate does not perform its function.

The present application discloses a technology for resolving the problem described above and aims at preventing the flexible substrate from not performing its function owing to electrical open of an electric circuit line of the flexible substrate caused by a break or a pinhole occurring in a portion of the patterned electric circuit lines printed on the substrate.

Means for Solving the Problem

A flexible substrate disclosed in the present application includes a base substrate layer formed of an insulation material; a front-side pattern layer on a front-side of the base substrate layer, on which pattern layer electric circuit lines is printed; and a back-side pattern layer on a back-side of the base substrate layer, on which pattern layer electric circuit lines are printed is printed, wherein the base substrate layer, the front-side pattern layer, and the back-side pattern layer are laminated together, and the flexible substrate has a deformed portion deformed concavely in a thickness direction of the flexible substrate.

Advantage Effect of the Invention

According to a flexible substrate disclosed in the present application, it is possible to prevent the flexible substrate from not performing its function owing to electrical open of an electric circuit line of the flexible substrate caused by a break or a pinhole occurring in a portion of the patterned electric circuit lines printed on the substrate.

DETAILED DESCRIPTION OF THE INVENTION

Embodiment 1

Figure 1:
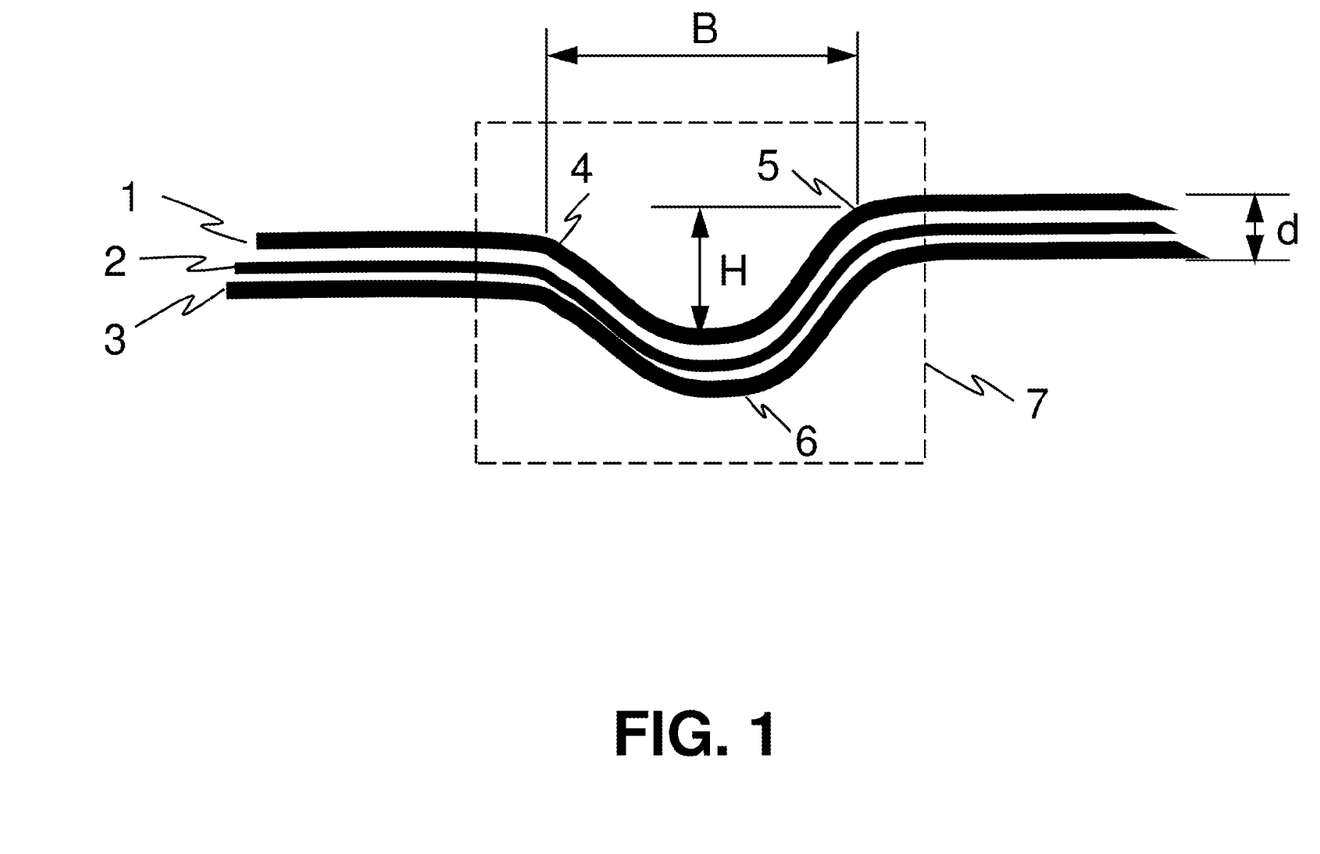
FIG. 1 is a schematic thickness-wise cross-sectional view showing an example of a flexible substrate according to Embodiment 1.

Embodiments of the present application are described hereinafter with reference to the drawings. FIG. 1 is a schematic thickness-wise cross-sectional view showing an example of a flexible substrate according to Embodiment 1 used for connecting an optical communication semiconductor package. It should be noted that while flexible substrates generally refer to those having flexibility, being repeatedly deformable by a relatively weak force, and having a property of keeping electrical characteristics when deformed, the flexible substrate here also keeps these characteristics.

Referring to FIG. 1, the flexible substrate includes three layers: at least one thin insulation base substrate layer 2 made of, for example, polyimide, in the thickness-wise middle part; a front-side pattern layer 1 just above on the base substrate layer 2, on which pattern layer at least one layer of electric circuit lines ordinarily made of copper is printed; and a back-side pattern layer 3 just below on the base substrate layer 2, on which pattern layer at least one layer of electric circuit lines ordinarily made of copper is printed. Note that although the figure is depicted for purposes of illustration as if these three layers are separated from each other and there are gaps between neighboring layers, the fact is that the neighboring layers are laminated together with adhesive and there are no gaps. The total thickness d of these three layers of the flexible substrate is set to 0.210±0.034 mm including tolerance.

Moreover, the flexible substrate actually used has a deformed portion 7 that is a portion concavely deformed along the widthwise direction in a lengthwise middle portion thereof as shown in FIG. 1, including a left deformed portion 4, a right deformed portion 5, and a middle deformed portion 6. Typical values of span B and the depth H shown in FIG. 1, which values indicate a deformed state of the deformed portion 7, are 0.55 mm and 0.25 mm, respectively, where the span B is defined as the minimum distance in the longitudinal direction of the flexible substrate between the left bending start point on the uppermost front-surface pattern layer of the deformed portion 4 and the right bending start point on the uppermost front-surface pattern layer of the deformed portion 5, and the depth H is defined as the maximum thickness-wise deformed amount of the uppermost cylindrically-deformed front-surface pattern layer. Note that the ratio H/B of the deformed portion 7 is set smaller than a value of 0.46.

The reason for thus using the flexible substrate having the concave portion formed beforehand is as follows. When the product is packaged, an end of the flexible substrate for an optical communication semiconductor package is attached by soldering to the package (the term "end" referred here is described in detail later). At this time, the flexible substrate is folded at the lengthwise middle portion thereof and attached to the package.

While a bending stress is generated in the flexible substrate when it is folded, using the flexible substrate having the deformed portion formed beforehand can more reduce the stress than using a flexible substrate having no deformed portion with it being folded.

A break or a pinhole occurs in a portion of the patterned electric circuit lines printed on the base substrate layer owing to the stress exerted on the flexible substrate when the flexible substrate for an optical communication semiconductor package is folded and soldered to the package. However, since the flexible substrate according to Embodiment 1 can reduce the stress as described above, it is possible to prevent the flexible substrate from not performing its function owing to electrical open of an electric circuit line of the flexible substrate caused by a break or a pinhole occurring in a portion of the patterned electric circuit lines printed.

Embodiment 2

Figure 2:
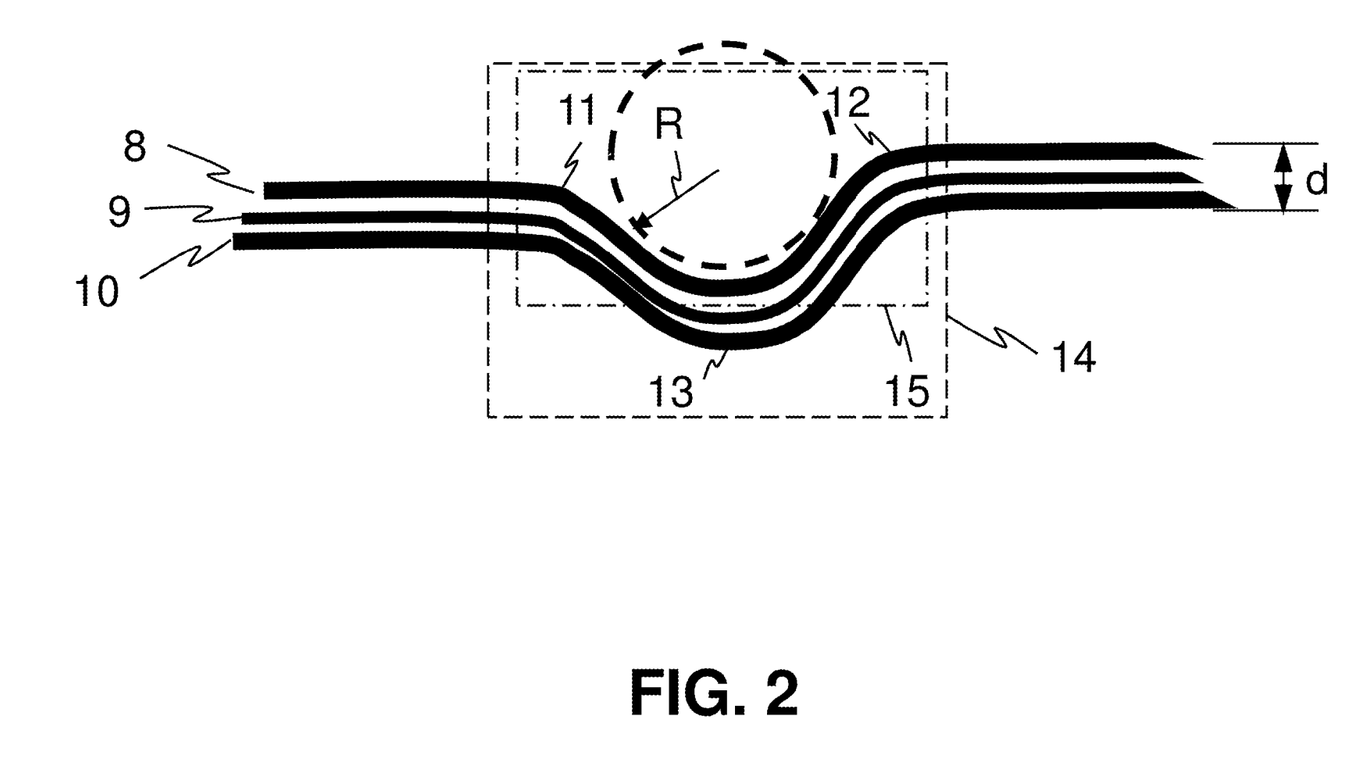
FIG. 2 is a schematic thickness-wise cross-sectional view showing an example of a flexible substrate according to Embodiment 2.

FIG. 2 is a schematic thickness-wise cross-sectional view showing an example of a flexible substrate according to Embodiment 2 used for connecting an optical communication semiconductor package communication.

As shown in FIG. 2, the flexible substrate includes three layers: at least one base substrate layer 9; a front-side pattern layer 8 just above on the base substrate layer 9, on which pattern layer at least one layer of electric circuit lines is printed; and a back-side surface layer 10 just below on the base substrate layer 9, on which pattern layer at least one layer of electric circuit lines is printed. The total thickness d of these three layers of the flexible substrate is set to 0.210±0.034 mm including tolerance, as with the case of Embodiment 1.

The flexible substrate actually used has a deformed portion 14 beforehand deformed concavely along the widthwise direction in a lengthwise middle portion thereof, which is a whole portion including a left and a right deformed portions 11, 12, and a middle deformed portion 13, as shown in FIG. 2.

Specifically, the portion between the left deformed portion 11 and the right deformed portion 12 is deformed in a cylindrical shape (the portion is referred to as a cylindrically deformed portion 15 below). Letting the curvature radius of the cylindrically deformed portion 15 be R with respect to the uppermost front-surface pattern layer, the cylindrically deformed portion is set so as to satisfy R>0.822 mm.

Using the curvature radius R and the thickness d, the maximum strain amount $\varepsilon_{max}$ of the flexible substrate shown in FIG. 2 is expressed as $\varepsilon_{max}=d/(2 \times R)$. The above expression shows that it is better to set larger the curvature radius R to reduce the maximum strain amount.

In FIG. 2, the total thickness d of the front-side pattern layer 8, the base substrate layer 9, and the back-side pattern layer 10 is 0.210±0.034 mm. Hence, the curvature radius R of the cylindrically deformed portion 15 between the left and right deformed portions 11, 12 is set so as to satisfy R>0.822 mm as described above. That is, the curvature radius R of the cylindrically deformed portion 15 is set so that d/R has a value smaller than 0.26 for the thickness d of the flexible substrate.

By setting in this way the curvature radius R of the cylindrically deformed portion 15, when the flexible substrate is folded and soldered to the package to package the product, the stress exerted on the flexible substrate can be reduced by the cylindrically deformed portion 15 having the curvature radius R set above.

As described above, in packaging the product, when the flexible substrate is folded and soldered an end of the flexible substrate to the package, the stress generated in the flexible substrate can be reduced by the cylindrically deformed portion 15 formed in the flexible substrate. Consequently, it is possible to prevent occurrence of a break or a pinhole in a portion of the patterned electric circuit lines printed on the base substrate layer. In other words, it is possible to prevent the flexible substrate from not performing its function owing to electrical open of an electric circuit line of the flexible substrate caused by a break or a pinhole occurring in a portion of the patterned printed on the base substrate layer.

Embodiment 3

Figure 3:
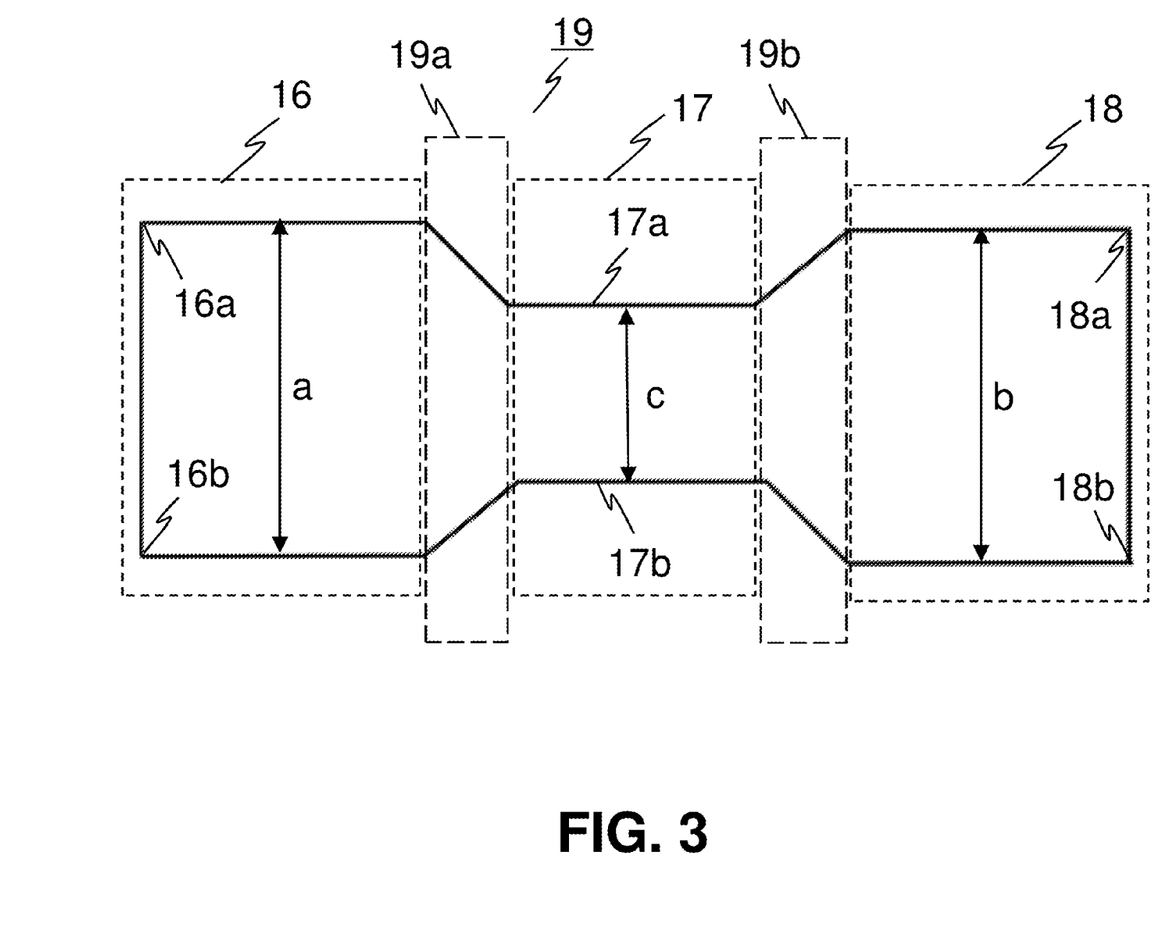
FIG. 3 is a schematic view showing an example of a flexible substrate according to Embodiment 3.

FIG. 3 is a schematic top view showing an example of a flexible substrate having the deformed portion described in FIG. 1 or FIG. 2 according to Embodiment 3 used for connecting an optical communication semiconductor package.

Referring to FIG. 3, the flexible substrate for an optical communication semiconductor package also includes in the thickness direction (not shown) a front-side pattern layer on which at least one layer of electric circuit lines is printed; at least one base substrate layer; and a back-side pattern layer on which at least one layer of electric circuit lines layer, and has three main sections: a left end section 16 having a width a, the distance between its corners 16a, 16b; a right end section 18 having a width b, the distance between its corners 18a, 18b; and a middle section 17 having a width c, the distance between its both side edges 17a, 17b.

Note that transition sections 19 (individual transition sections 19a, 19b between the left end section 16 and the middle section 17 and between the right end section 18 and the middle section 17, respectively) each have linear side edges for gradually changing its width to connect the side edges of the other sections, as shown in FIG. 3.

As described above, by forming the middle section 17 to have the width c between both side edges 17a, 17b smaller than the width a between the corners 16a, 16b of the left end section 16 and the width b between the corners 18a, 18b of the right end section 18, the flexible substrate becomes easy to fold at an middle in the longitudinal direction. In this case, the widths a and b are, for example, a≈b, and the width c is set to ½ a<c<½ b.

Consequently, when the flexible substrate is folded and an end of the flexible substrate (specifically, several centimeters of all electric circuit lines from, for example, the left end along the longitudinal direction) is soldered to the package when packaging the product in an actual use of the flexible substrate, a stress generated in the flexible substrate can be reduced by the small-width middle section 17.

As a result, it is possible to prevent occurrence of a break or a pinhole in a portion of the patterned electric circuit lines printed on the base substrate layer. In other words, since no breaks or no pinholes occur in a portion of the patterned electric circuit lines printed on the base substrate layer when the flexible substrate is folded, it is possible to prevent the flexible substrate from not performing its function owing to electrical open of an electric circuit line of the flexible substrate in packaging the product. Note that while the above describes taking the example of each individual section of the transition sections 19 having straight side edges, the shape of the side edges is not limited to this but may have, for example, a curved line such as an arc. In the case of a curved line also brings about the same effect as described above.

Embodiment 4

Figure 4:
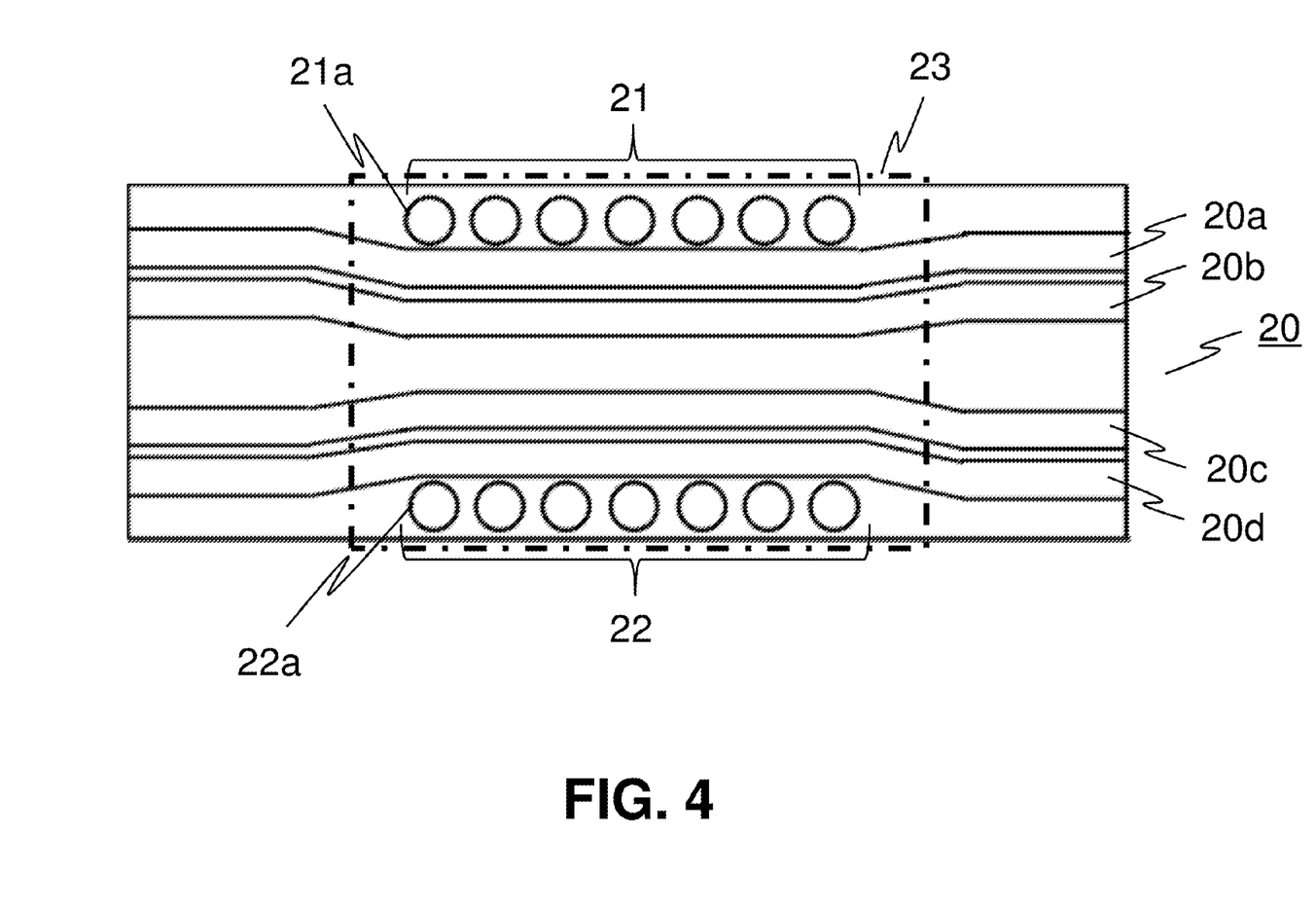
FIG. 4 is a schematic view showing an example of a flexible substrate according to Embodiment 4.

FIG. 4 is a schematic top view showing an example of an flexible substrate having the deformed portion described in FIG. 1 or 2 according to Embodiment 4 used for connecting an optical communication semiconductor package.

As shown in FIG. 4, the flexible substrate of Embodiment 4 for an optical communication semiconductor package includes a front-side pattern layer and back-side pattern layer on which at least one layer of pattered electric circuit lines 20 having four electric circuit lines 20a, 20b, 20c, 20d is printed, and has hole areas 21, 22 near both side edges of the flexible substrate, in which areas pluralities of though holes 21a and though holes 22a having a diameter of 10 µm or larger and smaller than 100 µm are formed. To be more specific, the through holes are formed near both side edges of a hole forming section 23 enclosed by the dash-dot line.

By thus providing the hole forming section 23, the flexible substrate becomes easy to fold and a stress generated in the flexible substrate by the folding is reduced when packaging the product in an actual use of the flexible substrate because stiffness of the hole forming section 23 is more reduced than the other sections.

Consequently, no breaks or no pinholes occur in a portion of the patterned electric circuit lines printed on the base substrate layer, thus being able to prevent the flexible substrate from not performing its function owing to electrical open of an electric circuit line of the flexible substrate caused by occurrence of a break or a pinhole in a portion of the patterned electric circuit lines of the flexible substrate.

Figure 5:
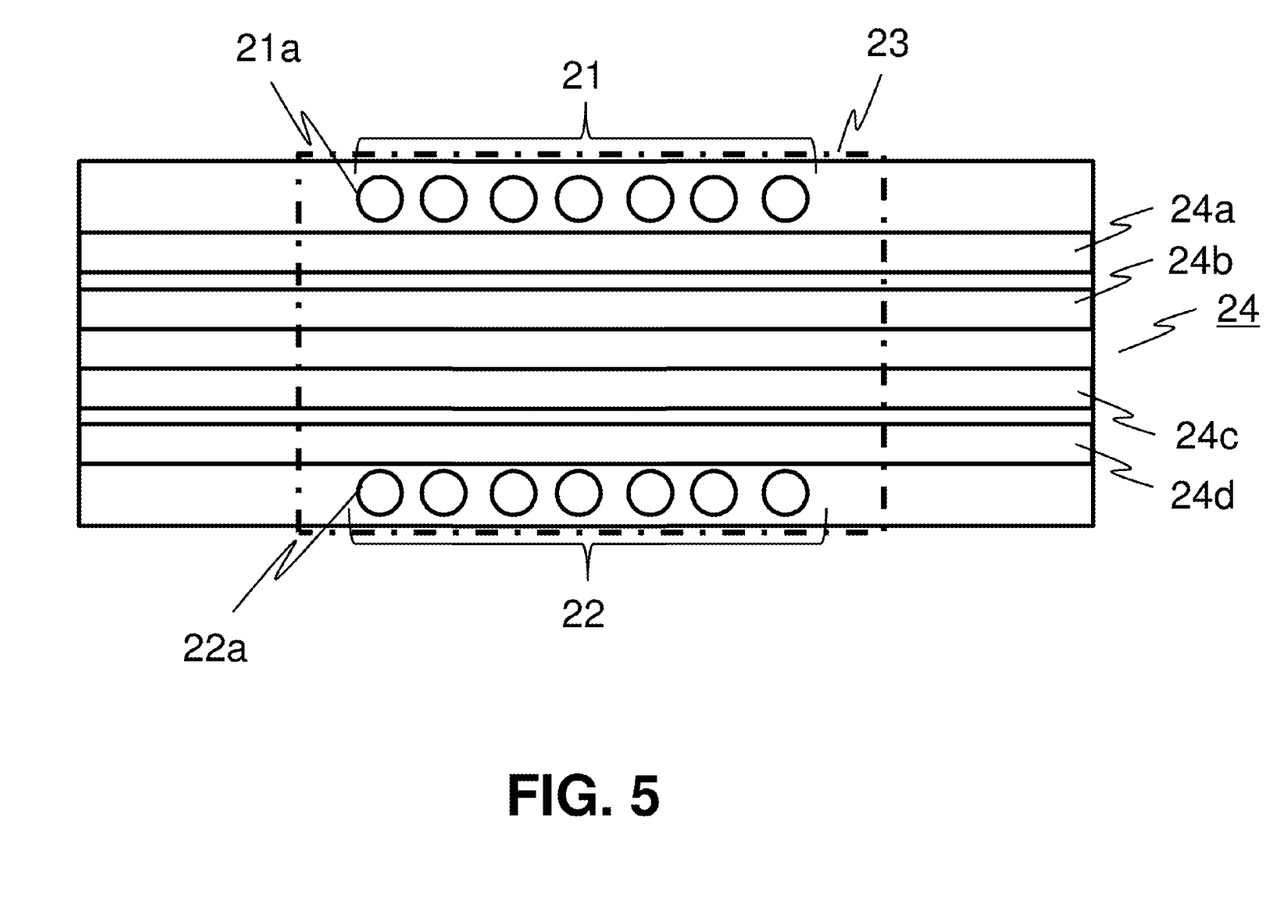
FIG. 5 is a schematic view showing another example of the flexible substrate according to Embodiment 4.

FIG. 5 is a schematic top view showing another example of the flexible substrate according to Embodiment 4, used for connecting an optical communication semiconductor package.

As shown in FIG. 5, in the another example of the flexible substrate of Embodiment 4 for an optical communication semiconductor package, patterned electric circuit lines 24 are different from the patterned electric circuit lines 20 shown in FIG. 4. To be more specifically described on the another example of the flexible substrate shown in FIG. 5, the patterned electric circuit lines 24 are printed linearly along the longitudinal direction of the flexible substrate without being bent in the middle. In this way, the positional arrangement of the holes formed in the flexible substrate are unchanged, and the four patterned electric circuit lines are printed, as a whole, more inside away from the side edges.

Since the patterned electric circuit lines are not bent in the middle, the patterned electric circuit lines are inherently assumed to be harder to damage when subjected to a stress by folding the flexible substrate. Accordingly, it is deemed that this flexible substrate can prevent more effectively occurrence of a break or a pinhole in a portion of the patterned electric circuit lines than the flexible substrate shown in FIG. 4.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

Specifically, in Embodiment 3, it is unnecessary that each electric circuit line is equidistant from the widthwise shape centerline of the flexible substrate, and the case of no equidistance also brings about the same effect as with the equidistant case. Moreover, in the case of each electric circuit line being equidistant from the widthwise shape center line, it is also unnecessary that each boundary of the hole forming section is equidistant from the lengthwise shape centerline.

Furthermore, while Embodiment 4 describes taking the example of the plurality of holes being formed in the hole areas 21 or 22, the number of holes is not limited to this. The same effect is also brought about for only one hole each is formed in the hole areas 21, 22.

1, 8: front-side pattern layer;
2, 9: base substrate layer;
3, 10: back-side surface layer;
4, 11: left deformed portion;
5, 12: right deformed portion;
6, 13: middle deformed portion;
7, 14: deformed portion;
15: cylindrically deformed portion;
16: left end section;
16a, 16b, 18a, 18b: corner;
17a, 17b: side edge;
17: middle section;
18: right end section;
19: transition sections;
19a, 19b: individual transition section;
20, 24: pattered electric circuit lines;
21, 22: hole area;
21a, 22a: holes; and
23: hole forming section.

The invention claimed is:
1. A flexible substrate comprising:
a base substrate layer formed of an insulation material;
a front-side pattern layer on a front-side of the base substrate layer, on which pattern layer electric circuit lines are printed; and
a back-side pattern layer on a back-side of the base substrate layer, on which pattern layer electric circuit lines are printed, wherein the base substrate layer, the front-side pattern layer, and the back-side pattern layer are laminated together, and the flexible substrate has a deformed portion deformed concavely in a thickness direction of the flexible substrate, and wherein widths of both end sections of the flexible substrate are larger than a width of a lengthwise middle section of the flexible substrate.

2. The flexible substrate of claim 1, wherein the deformed portion has a cylindrical shape, and letting a width and a depth of the deformed portion be B and H, respectively, H/B is set smaller than 0.46.

3. The flexible substrate of claim 1, wherein the deformed portion has a cylindrical shape, and letting a curvature radius of the deformed portion be R and a thickness of the flexible substrate be d, d/R is set to smaller than 0.26.

4. The flexible substrate of claim 1, wherein at least one hole is formed near each of side edges of the flexible substrate.

5. The flexible substrate of claim 2, wherein at least one hole is formed near each of side edges of the flexible substrate.

6. The flexible substrate of claim 3, wherein at least one hole is formed near each of side edges of the flexible substrate.

* * * * *